US008660156B2

(12) United States Patent
Telford et al.

(10) Patent No.: US 8,660,156 B2
(45) Date of Patent: Feb. 25, 2014

(54) METHOD AND SYSTEM FOR POWERING AND COOLING SEMICONDUCTOR LASERS

(75) Inventors: Steven J. Telford, Livermore, CA (US); Anthony S. Ladran, El Cerrito, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 472 days.

(21) Appl. No.: 12/813,662

(22) Filed: Jun. 11, 2010

(65) Prior Publication Data

US 2011/0051759 A1 Mar. 3, 2011

Related U.S. Application Data

(60) Provisional application No. 61/239,569, filed on Sep. 3, 2009.

(51) Int. Cl.
*H01S 3/04* (2006.01)

(52) U.S. Cl.
USPC .......................................................... 372/36

(58) Field of Classification Search
USPC .................................................... 372/34–36
See application file for complete search history.

(56) References Cited

U.S. PATENT DOCUMENTS

| | | | |
|---|---|---|---|
| 3,982,201 A | 9/1976 | Rosenkrantz et al. | |
| 4,739,462 A | 4/1988 | Farnsworth et al. | |
| 4,797,896 A | 1/1989 | Kane | |
| 5,444,728 A | 8/1995 | Thompson | |
| 5,463,648 A | 10/1995 | Gibbs | |
| 6,385,226 B2 * | 5/2002 | McMinn et al. | 372/50.1 |
| 6,757,314 B2 * | 6/2004 | Kneissl et al. | 372/50.1 |
| 7,545,137 B1 | 6/2009 | Lv | |
| 2003/0063884 A1 | 4/2003 | Smith et al. | |
| 2003/0161366 A1 * | 8/2003 | Fu et al. | 372/36 |
| 2005/0043909 A1 | 2/2005 | Poirier et al. | |
| 2005/0271111 A1 | 12/2005 | Rieger et al. | |
| 2008/0180075 A1 * | 7/2008 | Xie et al. | 323/282 |
| 2009/0204109 A1 | 8/2009 | Grove et al. | |

OTHER PUBLICATIONS

International Search Report and Written Opinion of PCT Application No. PCT/US2010/047719, mailed Oct. 28, 2010, 8 pages total.
Bayramian et al., "Diode Power Conditioning for LIFE" presented in 5th Workshop on High Energy Class Diode Pumped Solid State Lasers (HEC DPSSL), Dresden,Germany, Jun. 10, 2009; can be retrieved from the Internet: < http://www.fzd.de/db/Cms?pOid=29550>.

* cited by examiner

*Primary Examiner* — Jessica Stultz
*Assistant Examiner* — Tuan Nguyen
(74) *Attorney, Agent, or Firm* — Kilpatrick Townsend & Stockton LLP

(57) ABSTRACT

A semiconductor laser system includes a diode laser tile. The diode laser tile includes a mounting fixture having a first side and a second side opposing the first side and an array of semiconductor laser pumps coupled to the first side of the mounting fixture. The semiconductor laser system also includes an electrical pulse generator thermally coupled to the diode bar and a cooling member thermally coupled to the diode bar and the electrical pulse generator.

16 Claims, 6 Drawing Sheets

METHOD AND SYSTEM FOR POWERING AND COOLING SEMICONDUCTOR LASERS

CROSS-REFERENCES TO RELATED APPLICATIONS

The present application claims benefit under 35 U.S.C. §119(e) of U.S. Provisional Patent Application No. 61/239,569, filed on Sep. 3, 2009, entitled "Method and System for Powering and Cooling Semiconductor Lasers," the disclosure of which is hereby incorporated by reference in its entirety for all purposes.

STATEMENT AS TO RIGHTS TO INVENTIONS MADE UNDER FEDERALLY SPONSORED RESEARCH OR DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

BACKGROUND OF THE INVENTION

High average power diode pumped lasers are currently being used in or designed into an increasing number of laser systems. As the optical output power of these high average power diode pumped lasers increases, the input optical power required from the diode laser pumps typically increases as well. Since the efficiency of the diode lasers has been substantially constant during the last few years, increases in optical power are accompanied by increases in electrical input power. In some applications, currents on the order of hundreds of amps are needed to drive the diode laser pumps. As a result, precise current regulation using power conditioning electronics are challenging.

Thus, there is a need in the art for improved methods and systems for diode laser pumps suitable for high average power diode pumped laser applications.

SUMMARY OF THE INVENTION

According to the present invention, techniques related to optical systems are provided. More particularly, an embodiment of the present invention provides a semiconductor laser pump module with integrated pulse generator. Merely by way of example, the invention has been applied to an array of semiconductor laser bars sharing a common cooling structure with the drive electronics for the pulse generator. The methods and systems described herein are also applicable to numerous optical systems including lasers, amplifiers, and the like.

According to an embodiment of the present invention, a semiconductor laser system is provided. The semiconductor laser system includes a diode laser tile. The diode laser tile includes a mounting fixture having a first side and a second side opposing the first side and an array of semiconductor laser pumps coupled to the first side of the mounting fixture. The semiconductor laser system also includes an electrical pulse generator thermally coupled to the diode laser tile and a cooling structure thermally coupled to the diode laser tile and the electrical pulse generator.

According to another embodiment of the present invention, a semiconductor laser pump unit is provided. The semiconductor laser pump unit includes a semiconductor laser source and a heat sink thermally coupled to the semiconductor laser source. The semiconductor laser pump unit also includes a pulse generator thermally coupled to the heat sink. The pulse generator includes a sense resistor connected to a power supply and a field effect transistor connected to ground.

According to yet another embodiment of the present invention, a method of operating a semiconductor laser pump unit is provided. The method includes applying DC power to a charge storage capacitor and a power bus and applying a current pulse to a drive amplifier connected to a current control FET. The method also includes flowing a current through the current control FET in response to applying the current pulse to the drive amplifiers and flowing the current through a sense resistor connected to the power bus. The method further includes sensing the current using a sense amplifier coupled to a first terminal of the sense resistor and a second terminal of the sense resistor and flowing the current through a semiconductor laser array to produce pump light.

Numerous benefits are achieved by way of the present invention over conventional techniques. For example, the present systems provide integrated cooling of both semiconductor laser pumps and components of the electrical pulse generator used in driving the semiconductor laser pumps. Mounting of components of the electrical pulse generator in thermal communication with the cooling structure used to cool the semiconductor laser pumps reduces the system size and cost. Embodiments of the present invention provide a diode laser pump tile that reduces system cost and enhances reliability by integrating the pulse power electronics directly into the diode laser pump tile submount. Merely by way of example, pulsed power cost can be reduced by more than 40 times and the pulser electronics envelope can be reduced by more than 20 times. Moreover, some embodiments incorporate in-situ integrated intelligence for sensing and monitoring diode performance in order to prevent catastrophic cascading damage, also referred to as fratricide. Depending upon the embodiment, one or more of these benefits may be achieved. These and other benefits will be described in more detail throughout the present specification and more particularly below.

These and other objects and features of the present invention and the manner of obtaining them will become apparent to those skilled in the art, and the invention itself will be best understood by reference to the following detailed description read in conjunction with the accompanying drawings.

DETAILED DESCRIPTION OF SPECIFIC EMBODIMENTS

Typically, power conditioning electronics used for high power diode laser (i.e., semiconductor laser) pumps are either actively cooled or limited in their duty cycle. As an example, the power conditioning electronics used to drive the diode laser pumps used in the Mercury laser at Lawrence Livermore National Laboratory (LLNL) were actively cooled. In other laser systems, the control of the duty factor of the power conditioning electronics necessitated by thermal concerns may limit the operational characteristics of the laser.

Embodiments of the present invention integrate one or more components of the power conditioning system and the diode monitoring system with the diode package, thereby providing benefits not available using conventional systems. These benefits may include: (1) eliminating the need for a separate cooling system for the power conditioning electronics; (2) eliminating the duty factor limitation due to thermal constraints associated with the power conditioning electronics; (3) reducing the physical size of the power conditioning electronics; (4) increasing the overall system efficiency; (5) reducing power conditioning costs by at least an order of magnitude; and (6) enabling Inertial Fusion Energy (IFE) to be a competitive energy source.

High average power diode laser arrays used for pumping of laser amplifiers, which will be used for IFE power plants, utilize power conditioning systems to pulse the diode laser arrays at precise currents, pulse rates, and duty factors. According to an embodiment of the present invention, one or more components of the power conditioning electronics and monitoring systems will be moved from a remote electronics chassis to the diode laser package. Because the diode package is already actively cooled, the power conditioning will take advantage of the same cooling as the diode package. Thus, the high power components, the drive circuits, the monitoring circuits, and depending on capacitor development, the intermediate energy storage capacitor, are provided in thermal communication with the diode package in order to take advantage of the cooling capability provided for the diode laser package, thereby reducing the overall size of the power conditioning system and potentially reducing the cost by an order of magnitude.

Embodiments of the present invention are useful for a variety of high average power diode pumped lasers. These lasers may include the Mercury Laser, directed energy laser systems such as the tailored-aperture ceramic laser (TACL), laser design prototypes, rep-rated femtosecond, petawatt, diode pumped high average power lasers, inertial fusion energy power plants, directed energy weapons systems, rep-rated laser induced HED physics, laser machining applications, and other laser applications including high power diode laser pumping.

Figure 1:
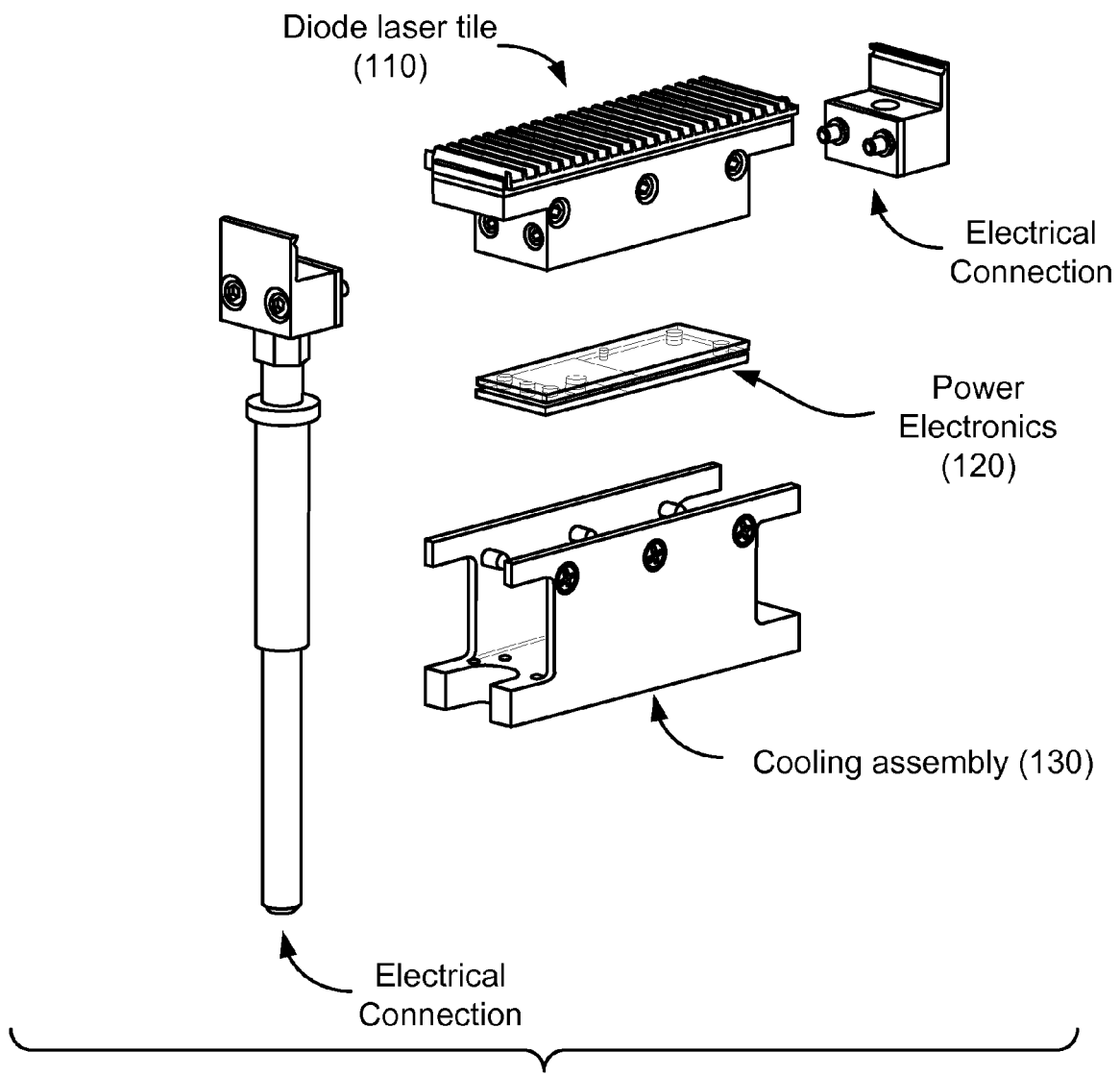
FIG. 1 is a simplified schematic diagram of a semiconductor laser pump unit according to an embodiment of the present invention.

FIG. 1 is a simplified schematic diagram of a semiconductor laser pump unit according to an embodiment of the present invention. The semiconductor laser pump unit includes a diode laser tile 110 that includes an array of semiconductor laser bars. The semiconductor laser bars making up the array are characterized by an output power, for example, 100 W per bar. These high power diode laser pumps are suitable for pumping of laser gain medium as will be evident to one of skill in the art. Electrical connectors provide drive current for the semiconductor laser bars in the diode laser tile. Typical drive currents for the diode laser tile are on the order of hundreds of amps.

The semiconductor laser pump unit also includes power electronics 120, which contains one or more components of an electrical pulse generator. As described more fully throughout the present specification, the power electronics 120 (also referred to as pulse control electronics) include a sense resistor and a power control field effect transistor (FET), which are components of the electrical pulse generator. A cooling assembly 130 is provided to remove heat generated by the semiconductor laser pump unit and the power electronics. Because the diode laser bars operate at less than 100% electrical to optical efficiency, the high power output of the diode laser bars is accompanied by significant heat generation. The cooling assembly 130 provides for active cooling of the diode laser bars. Additionally, the cooling assembly 130 is used to remove heat from power electronics 120. Thus, the diode laser bars and the cooling electronics share a common heat sink or cooling structure.

Figure 2:
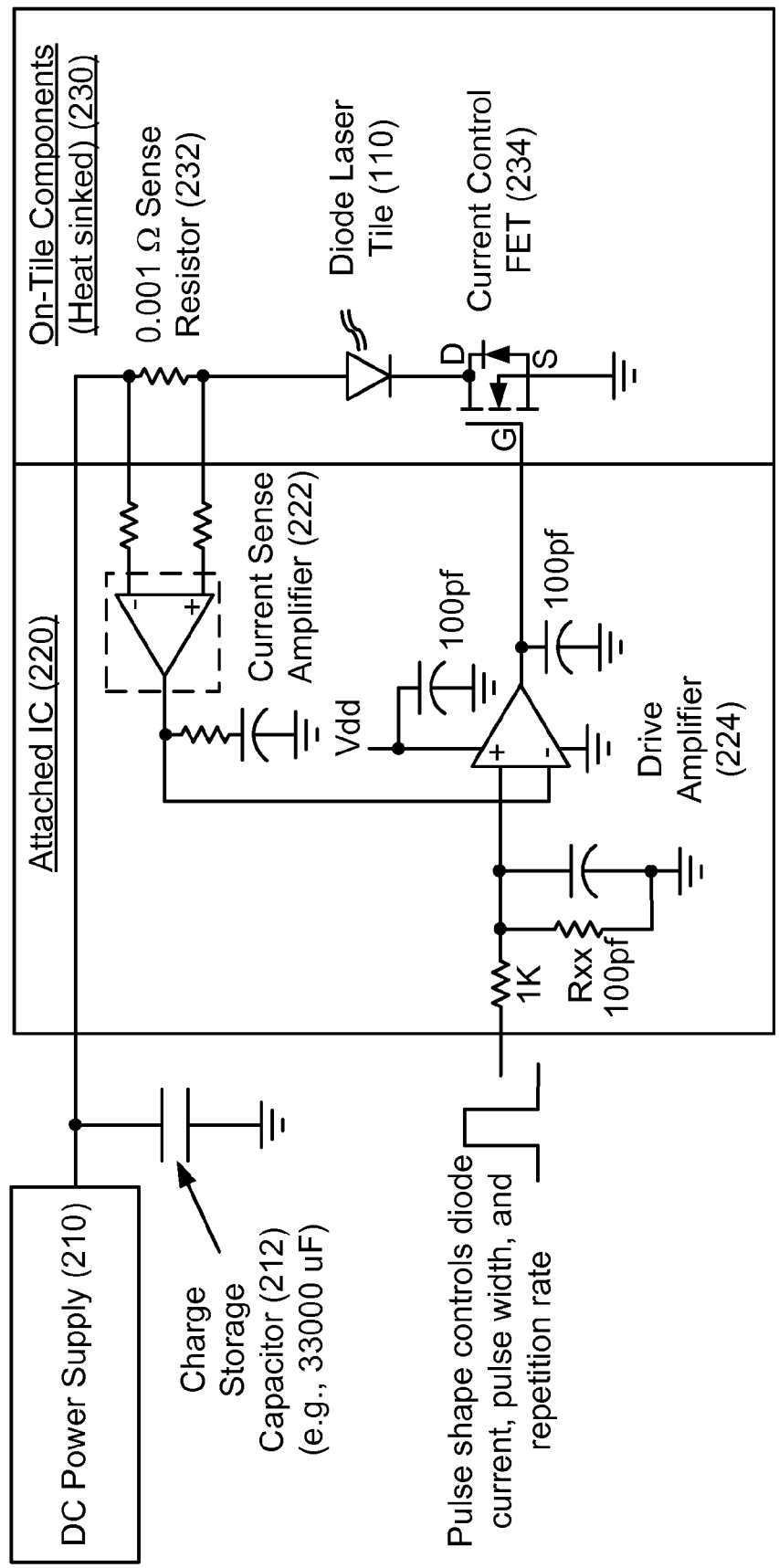
FIG. 2 is a simplified schematic diagram of a power conditioning circuit according to an embodiment of the present invention.

Utilizing the common heat sink provided by the cooling assembly, one or more components of the electrical pulse generator are cooled to remove heat generated by the large diode currents (e.g., 100's of amps) carried by the electronics. As illustrated in FIG. 1, embodiments of the present invention position the power electronics adjacent to the diode laser tile, where sufficient cooling capability already exists. As an example, the pulse drive circuit and the performance monitor circuit, illustrated in FIG. 2, are mounted to a surface of the diode laser tile using high density surface mount technology. According to embodiments of the present invention, diode packages are provided that output 12 KW of optical power (e.g., 60 bars at 200 W/bar) with a pulse width of 1,000 µs and a repetition rate of ~10 Hz. As an example, a the diode lasers can operate at 60% electrical to optical efficiency.

According to embodiments of the present invention, the size of the various elements of the diode laser tile are such that the power components can fit on the footprint of the diode tile. Referring to FIG. 1 and FIG. 2, in an exemplary embodiment, the current control FET 234 has a nominal footprint of 10 mm×15 mm (including leads). As an example, the current control FET 234 can operate at up to 40 V with a pulsed current of 790 A and a continuous current of 200 A, thereby operating at up to 230 W and dissipating 61.5 W. As an example, the form factor can be a TO-263 outline. In this exemplary embodiment, the sense resistor 232, which is a 0.001Ω resistor has a nominal footprint of 7 mm×13 mm (including leads). As an example, the sense resistor is a 1 mΩ resistor with a 0.5% tolerance operating at up to 3 W and dissipating 2.25 W. For a diode tile footprint of 19.4 mm×12.4 mm, both the current control FET 234 and the sense resistor 232 can be attached to the diode tile cooling block adjacent to each other to provide cooling to these components. In an embodiment, 56 diode laser tiles are utilized to form a larger diode laser array. Other control electronics can be mounted on a mezzanine board that has the same or similar footprint to the diode tile.

Referring to FIG. 1, because embodiments of the present invention provide a diode laser tile module that integrates the cooling assembly and power electronics at a position below the footprint of the diode laser tile, the modules can be integrated in an array with little to no space needed between adjacent tiles. As a result, since the electronics are located on the back of the array, the diode heat sinking is provided in a manner that reduces or eliminates complications. Embodiments of the present invention provide a diode laser system in which the components that need to be actively cooled (e.g., the current control FET and the current sense resistor) are attached to the diode laser tile cooling block, for example, the cooling assembly 130 so that the same cooling system used to cool the diode lasers is used to cool these components.

FIG. 2 is a simplified schematic diagram of an electrical pulse generator, also referred to as a power conditioning circuit according to an embodiment of the present invention. The power conditioning circuit illustrated in FIG. 2 includes a DC power supply connected to a charge storage capacitor. The illustrated embodiment, the charge storage capacitor has a rating of 33000 μF. An attached IC includes a current sense amplifier, a drive amplifier and associated resistors and capacitors. One or more of the components are mounted in thermal communication with the cooling assembly 130. These components are referred to as on-tile components since they are also in thermal communication with the diode laser tile and may be mounted on a fixture that is attached to the diode laser tile. The on-tile components include a current sense resistor and a current control FET. The current sense resistor illustrated in FIG. 2 has a rating of 0.001 ohms. The diode laser tile is connected between the current sense resistor, which is connected to the DC power supply, and the current control FET, which has one terminal that is grounded. The diode laser tile includes an array of semiconductor laser bars. Typically, each bar includes a number of semiconductor lasers in an array configuration.

In order to efficiently remove heat from the power control and power monitoring electronics, including the current control FET, one or more components of the electrical pulse generator can be mounted onto a surface of the diode laser tile. In an embodiment, the high power current control FET is mounted in raw die format in thermal communication with the cooling assembly that is also in thermal communication with the diode laser tile. Mounting of the current control FET in raw die format saves space and takes advantage of the cooling capacity utilized to cool the diode laser tile. In addition to the current control FET, the current sense resistor is another high power component that can be mounted in thermal communication with the cooling assembly. The current sense resistor, designed for current sensing applications, is thus cooled by conduction or convection using the cooling structure.

Referring to FIG. 2, in an embodiment, the charge storage capacitor, also referred to as an intermediate energy storage system, is mounted in thermal communication with the cooling structure. For example, the charge storage capacitor can be mounted on a surface of the diode tile in addition to one or more components of the electrical pulse generator. The integration of the power conditioning components with the diode laser tile allows for a significant reduction in size and cost in comparison with conventional methods in which this functionally has been located in a remote chassis.

According to embodiments of the present invention, the semiconductor laser pump unit illustrated in FIG. 1 enables a system designer to optimize pump unit efficiency and lower cost in comparison with conventional systems. The inventors have determined that a mean time between failure of more than three years is provided by embodiments of the present invention.

According to an embodiment of the present invention, 110 watts are delivered to the diode laser tile at a operating voltage of 24 Volts DC. In other embodiments, the operating voltage is higher, for example, up to 100 V DC. Energy storage in the charge storage capacitor is on the order of 6.1 Joules and can be up to 10 Joules. As illustrated in FIG. 1, the electrical pulse generator and diode laser tile can be an integrated assembly with non-repairable components. The electrical pulse generator can be constructed onto the diode laser tile substrate as the diodes are being mounted. In a particular embodiment, the current control FET (in die form) is mounted directly on the diode substrate, saving space in comparison with other mounting techniques. Control over the diode laser optical output can be provided by using the electrical pulse generator input trim resistor when the diode laser pump unit is manufactured.

Referring to FIG. 2, the design of the electrical pulse generator provides a number of advantages in comparison with conventional systems. For example, this design extrapolates well to larger arrays, where the DC power will be greater than 100 V because the Drive Amplifier 224 is ground referenced. Additionally, the bias voltage of the Drive Amplifier 224 can be obtained from a Zener regulator based on the diode power.

As an alternative to the embodiment illustrated in FIG. 2, another embodiment switches the positions of the diode laser tile 119 and the current control FET 234, with the current control FET connected to the current sense resistor and the diode laser tile attached to ground. In this alternative embodiment, the bias voltage for the Driver Amplifier 224 can be obtained from a Zener regulator off of the diode power. In this alternative embodiment, the diode lasers are ground referenced, which can provide benefits in relation to packaging of the diode lasers.

Referring once again to FIGS. 1 and 2, a semiconductor laser system is provided that includes a diode laser tile 110 that includes a mounting fixture having a first side and a second side opposing the first side. An array of semiconductor laser pumps are coupled to the first side of the mounting fixture, the top side in the illustrated embodiment. Typically, each semiconductor laser pump of the array of semiconductor laser pumps includes an array of semiconductor lasers. As shown in FIG. 1, a plurality of lenslet arrays are coupled to the array of semiconductor laser pumps in order to collimate the light emitted by the semiconductor lasers, also referred to as diode lasers.

Additionally, an electrical pulse generator, illustrated by the power electronics 120 in FIG. 1 is thermally coupled to the diode laser tile 100. As illustrated in FIG. 1, one or more components of the electrical pulse generator (e.g., a FET in die form and a sense resistor) are mounted to the second side of the mounting fixture. A cooling structure illustrated by cooling assembly 130 is thermally coupled to the diode laser tile and the electrical pulse generator.

In some embodiments, one or more components of the electrical pulse generator are mounted on a third side of the mounting fixture disposed between the first side and the second side. Referring to FIG. 1, the third side is a vertical side of the diode laser tile 110.

According to another embodiment of the present invention, a semiconductor laser pump unit is provided that includes a semiconductor laser source (e.g., an array of semiconductor laser bars, each including an array of semiconductor lasers) and a heat sink thermally coupled to the semiconductor laser source. The semiconductor laser pump unit also includes a pulse generator thermally coupled to the heat sink. The pulse generator includes a sense resistor connected to a power supply (e.g., a DC power supply) and a field effect transistor connected to ground. In some embodiments, the field effect transistor is mounted in die form. The heat sink is typically in thermal communication with a cooling fluid, such as chilled water. In an embodiment, a first end of the sense resistor is connected to a first terminal of a current sense amplifier and a second end of the sense resistor is connected to a second terminal of the current sense amplifier.

Figure 3:
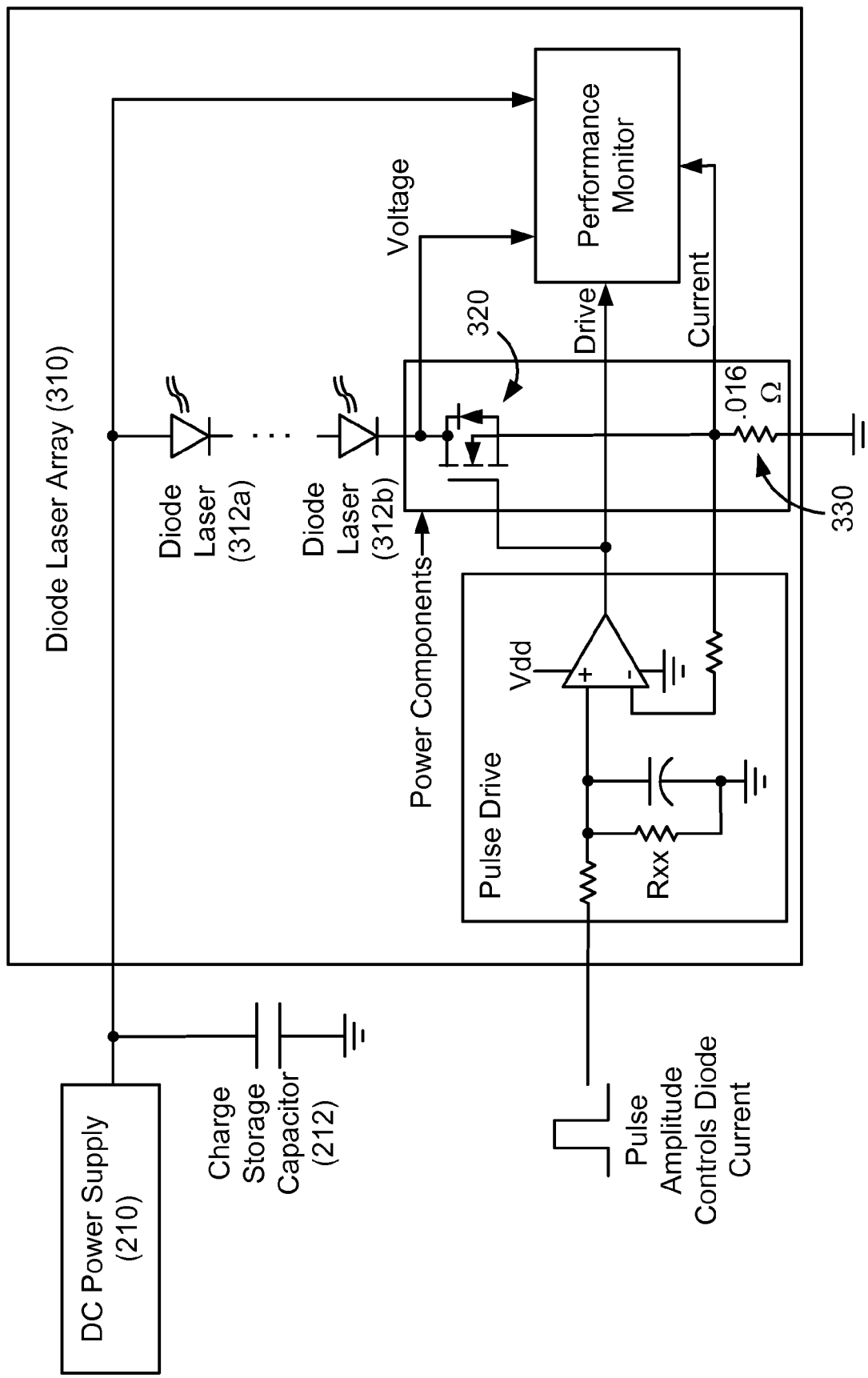
FIG. 3 is a simplified schematic diagram of a power conditioning circuit according to an embodiment of the present invention.

FIG. 3 is a simplified schematic diagram of an electrical pulse generator according to an embodiment of the present invention. The electrical pulse generator illustrated in FIG. 3 shares common components with the one illustrated in FIG. 2. In the embodiment illustrated in FIG. 3, the diode laser array 310, which includes a plurality of diode lasers 312a, 312b, etc., is connected to the DC power supply 210. The charge storage capacitor 212 is also coupled to the DC power supply 210 and the diode laser array 310. The current control FET 320 is connected to the diode laser array 310 and the current sense resistor 330, which has a terminal grounded. As illustrated in FIG. 3, the power components are actively cooled using the cooling assembly that is used to cool the diode lasers 312a, 312b, etc. in the diode laser array 310. Utilizing the embodiment illustrated in FIG. 3, the diode laser array can be fabricated in the form of a tile that reduces costs and enhances reliability by integrating the pulse power electronics directly into the diode laser tile submount. As examples, the pulsed power cost can be reduced by more than a factor of 40 and the pulser electronics envelope can be reduced by about a factor of 20.

Referring to FIG. 3, the design of the electrical pulse generator provides a number of advantages in comparison with conventional systems. For example, the Drive Amplifier bias voltage can be obtained from Zener regulator off of diode power. Additionally, the diodes are ground referenced, which facilitates packaging. The pulse drive shares common components with the attached IC 220 illustrated in FIG. 2. A performance monitor 340 is provided that receives voltage, drive, and current as inputs and can be used to monitor performance of the diode laser array 310 as well as other system components. The performance monitor 340 can sense and monitor diode laser performance to prevent catastrophic cascading failure.

Embodiments of the present invention enable a backplane design that enables parallel connection of tiles for enhanced reliability and close proximity to pulsers. As an example, a backplane with ten laser bars connected in series provides an operating voltage of approximately 20 V. This configuration decreases the probability of catastrophic tile failure due to contact or bar failure operating at about 20 V, which is an operating voltage below "high voltage" levels. In this configuration, failure of a tile will result in a reduced number of bars that are affected and increases the space available for the mounting hardware for the array pulsers.

Figure 4:
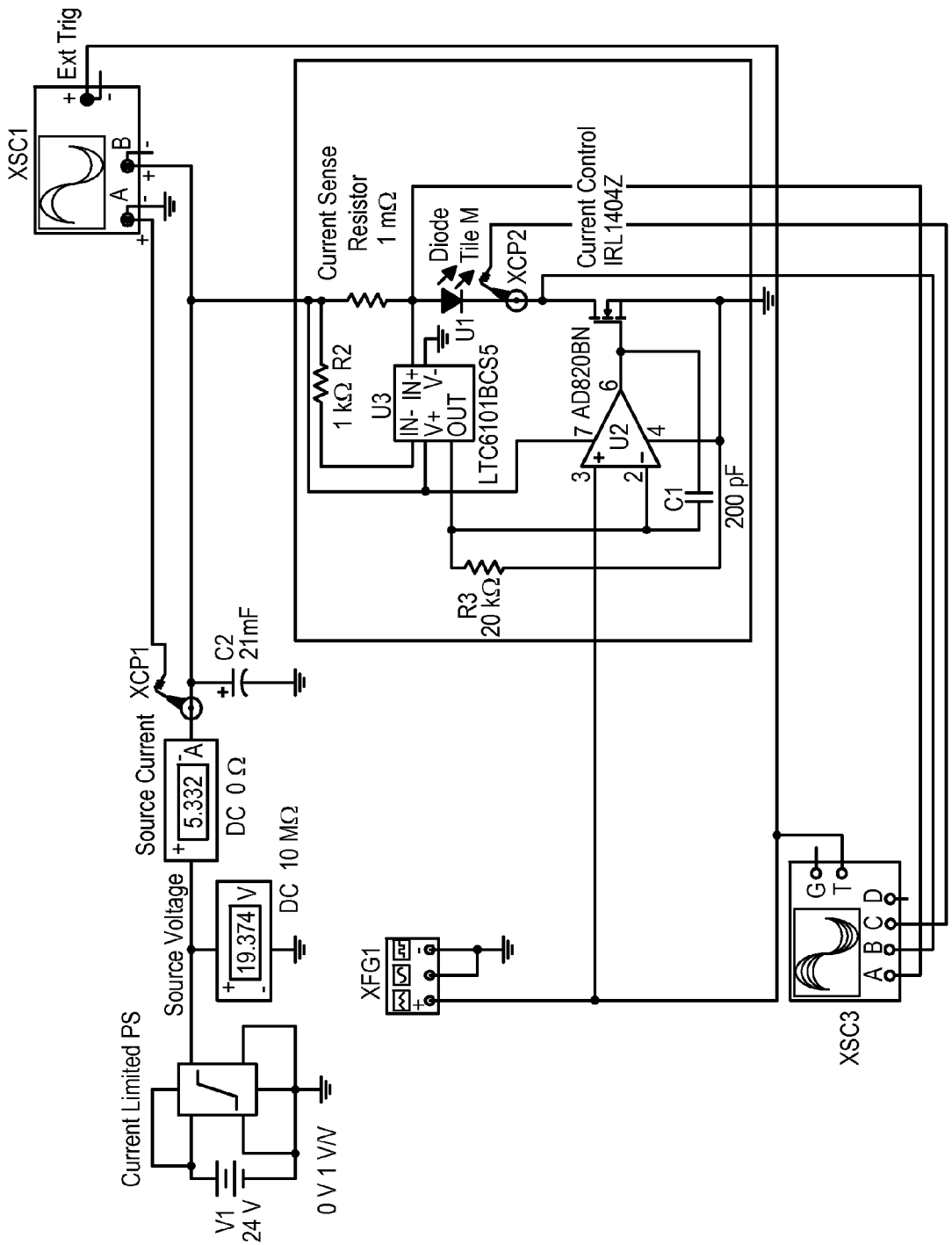
FIG. 4 is a circuit schematic for a Multisim model of the power conditioning circuit illustrated in FIG. 2.

FIG. 4 is a circuit schematic for a Multisim model of the power conditioning circuit illustrated in FIG. 2. A similar model can be constructed for the electrical pulse generator illustrated in FIG. 3. The Multisim model includes a current limited power supply providing a source current at a source voltage. The current sense resistor 232, the diode laser tile 110 and the current control FET 234 are included in the model as On Tile Components, representing their mounting on the cooling assembly that is used to actively cool the diode lasers. The current sense amplifier 222 and the drive amplifier 224 are also illustrated in the model shown in FIG. 4.

Figure 5A:
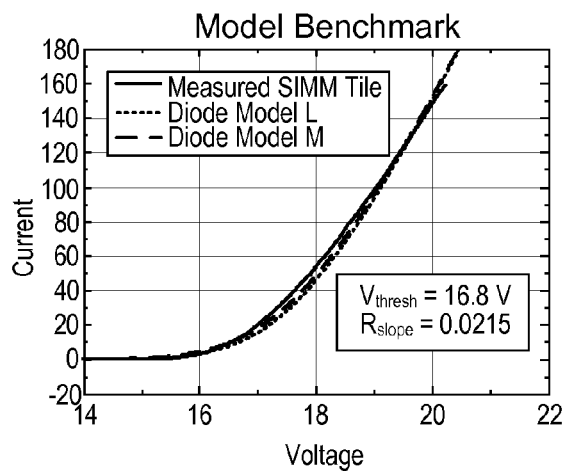
FIG. 5A illustrates a model benchmark output from the Multisim model shown in FIG. 4.

FIG. 5A illustrates a model benchmark output from the Multisim model shown in FIG. 4. As illustrated in FIG. 5A, the measured SIMM tile current is plotted along with the current predicted using two models: Diode Model L and diode Model M. Diode Model L represents one Multisim model of the diode load and Diode Model M represents a second Multisim diode load model. A threshold voltage of 16.8 V and an inverse slope of 0.0215 V/A are characteristic of both the measured as well as modeled results.

Figure 5B:
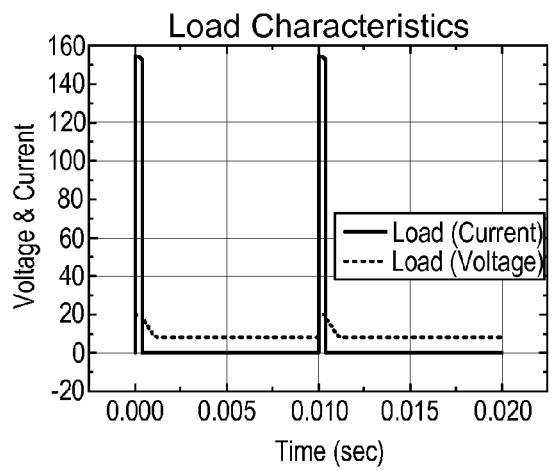
FIG. 5B illustrates load characteristics for the Multisim model shown in FIG. 4.

FIG. 5B illustrates load characteristics for the Multisim model shown in FIG. 4. The voltage applied to the load is substantially constant at approximately 20 V during the 1 ms time during which power is applied to the circuit. During the 1 ms time period following 1 ms of power application, the voltage applied to the load drops at a substantially linear rate to a value of about 10 V. The current applied to the load is substantially equal to 150 A during the 1 ms time during which power is applied to the circuit.

Figure 5C:
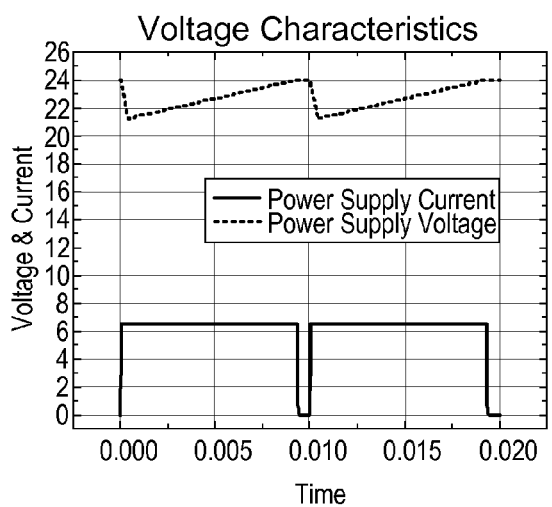
FIG. 5C illustrates power supply voltage and current characteristics for the Multisim model shown in FIG. 4.

FIG. 5C illustrates power supply voltage and current characteristics for the Multisim model shown in FIG. 4. The power supply current is substantially constant at approximately 6.5 A during the 1 ms time during which power is applied to the circuit as well as the following 8 ms, dropping to zero for a 1 ms time period during each 10 ms period. The power supply voltage drops from about 24 V to about 21 V during the 1 ms time during which power is applied to the circuit and then recovers to 24 V over the next 9 ms.

Figure 5D:
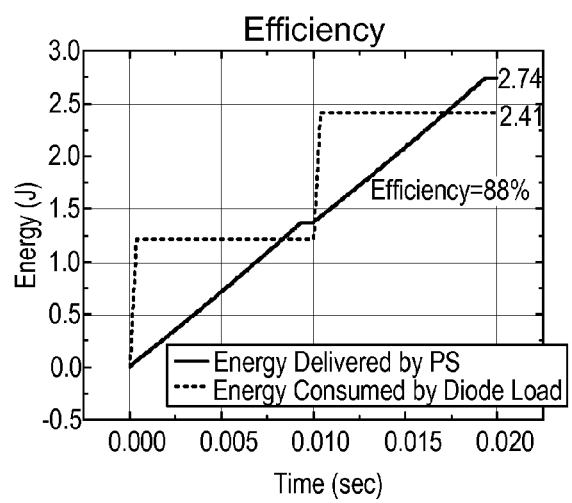
FIG. 5D illustrates efficiency for the Multisim model shown in FIG. 4.

FIG. 5D illustrates efficiency for the Multisim model shown in FIG. 4. FIG. 5D plots the energy consumed by the diode load in relation to the energy delivered by the power supply as a function of time. During the 1 ms time during which power is applied to the circuit, the energy consumed by the diode load increases from zero to about 1.25 J. During the next 9 ms, the energy consumed by the diode load remains constant prior to the next pulse. The energy delivered by the power supply increases linearly for the first 9 ms, increasing from zero to about 1.37 J, and then remaining constant for the next millisecond. For the second pulse, similar behavior is observed. At the end of the time period associated with the second pulse, the energy delivered by the power supply is 2.74 J and the energy consumed by the diode load is 24.1 J, producing an efficiency of 88%.

Figure 6:
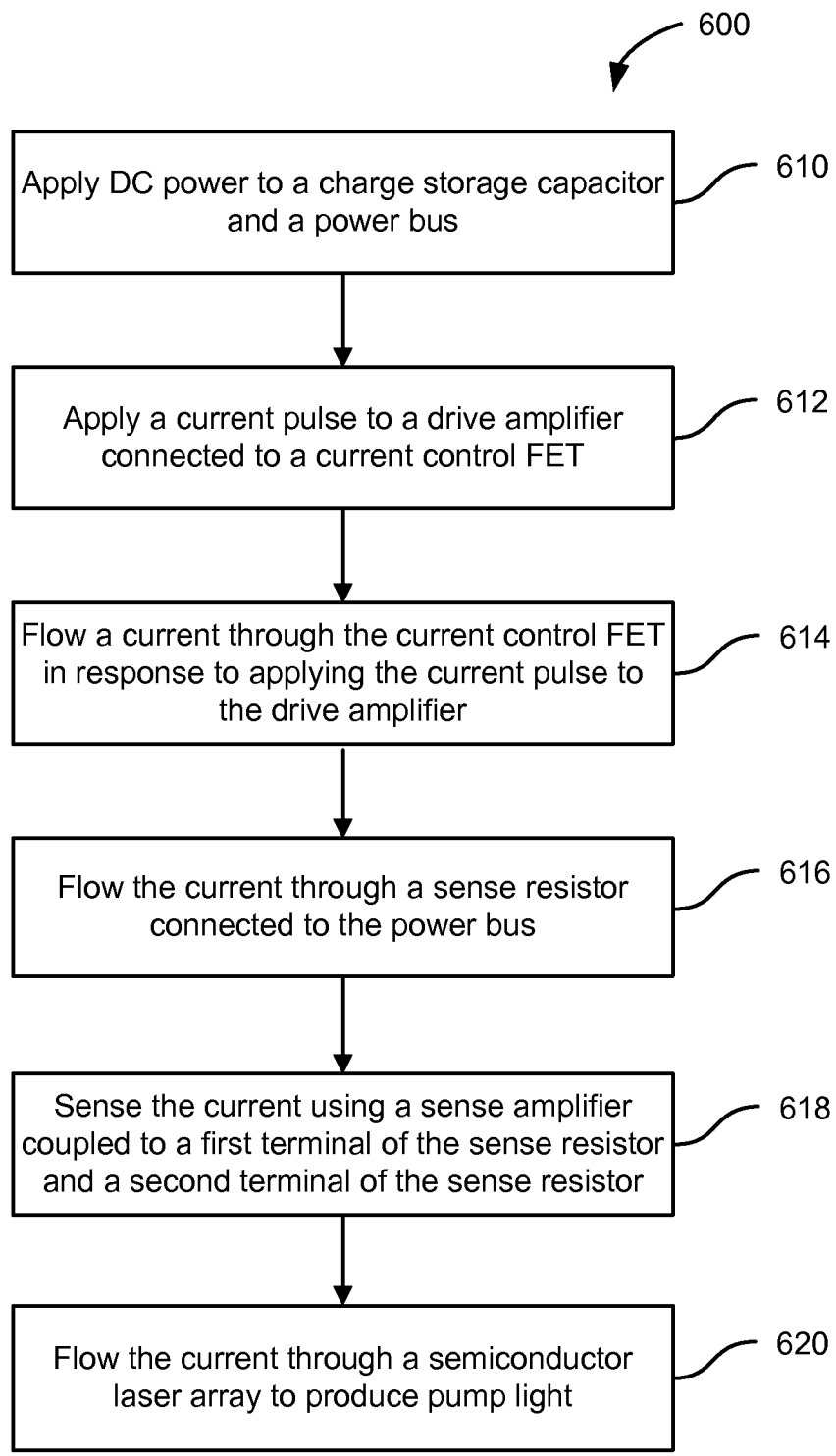
FIG. 6 is a simplified flowchart illustrating a method of operating a semiconductor laser pump unit according to an embodiment of the present invention.

FIG. 6 is a simplified flowchart illustrating a method of operating a semiconductor laser pump unit according to an embodiment of the present invention. The method 600 includes applying DC power to a charge storage capacitor and a power bus (610). The DC power can be applied to the charge storage capacitor using a DC power supply 210 as illustrated in FIG. 2. The method also includes applying a current pulse to a drive amplifier connected to a current control FET (612). The current pulse can be controlled by an external pulse source to provide a predetermined current, pulse width, and repetition rate, among other parameters. The method further includes flowing a current through the current control FET in response to applying the current pulse to the drive amplifier (614). In some embodiments, a terminal of the current control FET is grounded. The method also includes flowing the current through a sense resistor connected to the power bus (616) and sensing the current using a sense amplifier coupled to a first terminal of the sense resistor and a second terminal of the sense resistor (618). As illustrated in FIG. 2, the current control FET and the sense resistor are thermally coupled to a heatsink that is used to actively cool the diode laser tile, which includes a semiconductor laser array. Thus, the same cooling source is used to cool the semiconductor laser array as well as the current control FET and the sense resistor. The method further includes flowing the current through a semiconductor laser array to produce pump light (620).

It should be appreciated that the specific steps illustrated in FIG. 6 provide a particular method of operating a semiconductor laser pump unit according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

Table 1 illustrates diode driver specifications according to an embodiment of the present invention. The values shown in Table 1 are not intended to limit the scope of the present invention, but merely to illustrate exemplary specifications.

TABLE 1

| Characteristic | Specification |
| --- | --- |
| Pulse Amplitude (Amps) | 130-170 |
| Nominal Operating Point (Amps) | 150 |
| Pulse Width (μs) | 360 |
| Pulse Rate (Hz) | 100 |
| Footprint (mm$^2$) | <19.4 × 12.4 |
| Rise Time (μs) | 50 |
| Fall Time (μs) | 50 |
| Overshoot at Turn On (%) | 5 |
| Reverse Bias (V) | <1 |
| Operating Temperature (° C.) | 0-30 |
| Pulse Droop (%) | <2 |
| Ripple Current (%) | <2 |

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor laser system comprising:
    a diode laser tile comprising:
        a mounting fixture having a first side, a second side opposing and positioned below the first side, and a plurality of third sides extending between the first side and the second side; and
        an array of semiconductor laser pumps coupled to the first side of the mounting fixture;
    an electrical pulse generator coupled to the second side of the mounting fixture below the array of semiconductor laser pumps and thermally coupled to the diode laser tile; and
    a cooling structure having a base and a set of sides extending from the base to form an opening, each of the set of sides having opposing indentations, wherein:
        the electrical pulse generator is mounted to the base of the cooling structure, and
        the plurality of third sides of the mounting fixture are positioned in the opening, above the base, and between the set of sides of the cooling structure with each of the plurality of third sides of the mounting fixture making contact with and fit between the opposing indentations in one of the set of sides of the cooling structure, wherein the cooling structure is thermally coupled to the diode laser tile and the electrical pulse generator.

2. The semiconductor laser system of claim 1 wherein the mounting fixture comprises a shelf extending over a lower portion of the mounting fixture.

3. The semiconductor laser system of claim 2 wherein further comprising electrical connections partially disposed under the shelf between opposing indentations of the set of sides of the cooling structure.

4. The semiconductor laser system of claim 1 wherein each semiconductor laser pump of the array of semiconductor laser pumps comprises an array of semiconductor lasers.

5. The semiconductor laser system of claim 1 further comprising a plurality of lenslet arrays coupled to the array of semiconductor laser pumps.

6. The semiconductor laser system of claim 1 wherein one or more components of the electrical pulse generator are mounted to the second side of the mounting fixture.

7. The semiconductor laser system of claim 6 wherein the one or more components comprise a FET in die form and a sense resistor.

8. A semiconductor laser pump unit comprising:
    a diode laser tile comprising:
        a mounting structure having a first side and an opposing second side spatially separated from the first side by a plurality of third sides;
        a semiconductor laser source attached to the first side of the mounting structure;
    a heat sink thermally coupled to the diode laser tile, wherein the heat sink includes a base and a set of sides extending from the base to form an opening, each of the set of sides having opposing indentations, wherein the plurality of third sides of the mounting structure are positioned in the opening between the set of sides, each of the plurality of third sides being in contact with one of the set of sides and fit within the opposing indentations in one of the set of sides; and
    a pulse generator attached to the second side of the mounting structure below the semiconductor laser source and attached to the base of the heat sink between the set of sides, wherein the pulse generator comprises:
        a sense resistor connected to a power supply; and
        a field effect transistor connected to ground.

9. The semiconductor laser pump unit of claim 8 wherein the semiconductor laser source comprises an array of semiconductor laser bars.

10. The semiconductor laser pump unit of claim 8 wherein the heat sink is in thermal communication with a cooling fluid.

11. The semiconductor laser pump unit of claim 9 wherein the array of semiconductor laser bars comprise an array of semiconductor lasers.

12. The semiconductor laser pump unit of claim 8 wherein a first end of the sense resistor is connected to a first terminal of a current sense amplifier.

13. The semiconductor laser pump unit of claim 12 wherein a second end of the sense resistor is connected to a second terminal of the current sense amplifier.

14. The semiconductor laser pump unit of claim 8 wherein the field effect transistor is mounted in die form.

15. The semiconductor laser pump unit of claim 8 wherein the power supply comprises a DC power supply.

16. The semiconductor laser pump unit of claim 15 further comprising a capacitor coupled to the DC power supply.

* * * * *